United States Patent [19]
Yasui et al.

[11] Patent Number: 5,314,848
[45] Date of Patent: May 24, 1994

[54] METHOD FOR MANUFACTURING A SEMICONDUCTOR DEVICE USING A HEAT TREATMENT ACCORDING TO A TEMPERATURE PROFILE THAT PREVENTS GRAIN OR PARTICLE PRECIPITATION DURING REFLOW

[75] Inventors: Takatoshi Yasui; Chiaki Kudo; Ichiro Nakao; Toyokazu Fujii; Yuka Terai; Shinichi Imai, all of Osaka; Hiroshi Yamamoto, Chiba; Yasushi Naito, Osaka, all of Japan

[73] Assignee: Matsushita Electric Industrial Co., Ltd., Osaka, Japan

[21] Appl. No.: 764,846

[22] Filed: Sep. 24, 1991

[30] Foreign Application Priority Data

Sep. 25, 1990 [JP] Japan .................................. 2-255827
Sep. 25, 1990 [JP] Japan .................................. 2-255828

[51] Int. Cl.$^5$ ..................... H01L 21/00; H01L 21/02; H01L 21/324; H01L 21/477
[52] U.S. Cl. .................... 437/248; 437/247; 437/982; 148/DIG. 133
[58] Field of Search ............ 437/247, 248, 982; 148/DIG. 133

[56] References Cited

U.S. PATENT DOCUMENTS

| | | | |
|---|---|---|---|
| 3,887,733 | 6/1975 | Tolliver et al. | 437/982 |
| 4,284,659 | 8/1981 | Jaccodine et al. | 148/DIG. 133 |
| 4,420,503 | 12/1983 | Leung et al. | 437/982 |
| 4,455,325 | 6/1984 | Razouk | 437/982 |
| 4,474,831 | 10/1984 | Downey | 437/982 |
| 5,112,776 | 5/1992 | Marks et al. | 148/DIG. 133 |

FOREIGN PATENT DOCUMENTS

| | | | |
|---|---|---|---|
| 3425531 | 1/1986 | Fed. Rep. of Germany | 148/DIG. 133 |
| 0135127 | 6/1986 | Japan | 437/982 |
| 0237448 | 10/1986 | Japan | |
| 0308350 | 12/1988 | Japan | 437/982 |
| 0128527 | 5/1989 | Japan | 437/982 |

OTHER PUBLICATIONS

Wakamatsu, Oki Denki Research Development 140, vol. 55, 1988, pp. 123-128.
Matsushita, 26a-D-5, Autumn Meeting of Japanese Applied Physics Society, No. 51, 1990, p. 546.

Primary Examiner—Brian E. Hearn
Assistant Examiner—B. Everhart
Attorney, Agent, or Firm—Willian Brinks Olds Hofer Gilson & Lione

[57] ABSTRACT

Described is a method for manufacturing semiconductor devices which includes a heat treating process for heating and cooling semiconductor substrates mounted on a boat at a predetermined pitch according to a predetermined temperature profile, in order to flatten the surface of each semiconductor substrate by reflowing an insulating film containing impurities, for example, a BPSG film formed on the substrate. In the heat treating process, one of the control factors which affects the formation of grains or particles due to the impurities contained in the insulating film is set so as to prevent the impurities from generating grains or particles during the heat treatment. Also disclosed is a method of preventing the generation of grains or particles by widening the pitch of the mounted substrates.

11 Claims, 14 Drawing Sheets

9/16 inch

Fig. 4

| | Profile After Heat Treatment | Number of grains in a view field |
|---|---|---|
| (a) | 900°C ——— 5°C/min ——— 700°C<br>Pyrogenic  N₂ Atmosphere | 11 |
| (b) | 900°C ——— ←850°C ——— 700°C<br>Pyrogenic  N₂ | 0 |
| (c) | 900°C ——— ←800°C ——— 700°C<br>Pyrogenic  N₂ | 1 |
| (d) | 900°C ——— ——— 700°C<br>N₂  Pyrogenic  N₂ | 0 |

FIG. 13(A)
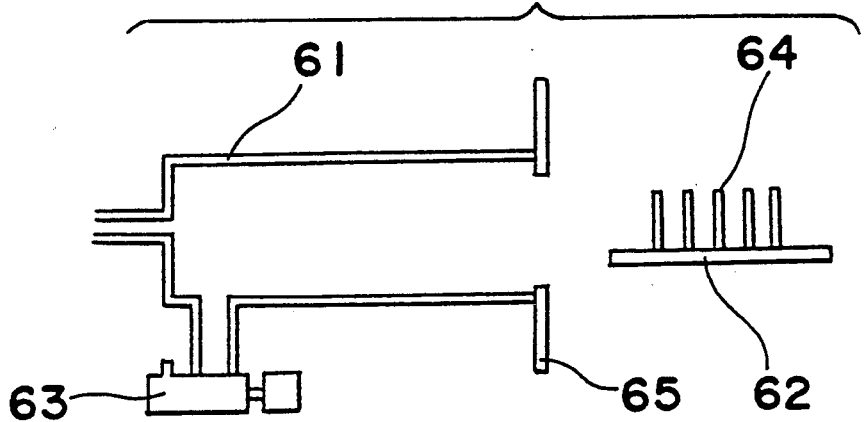
FIG. 13(B)
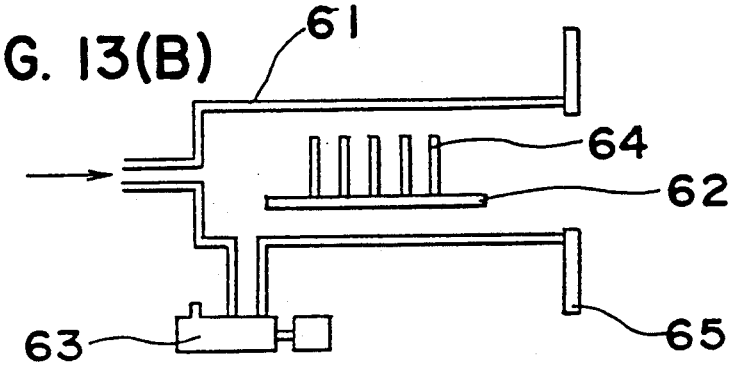
FIG. 13(C)
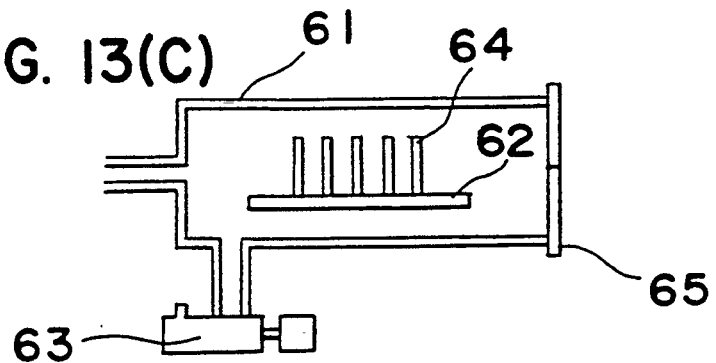
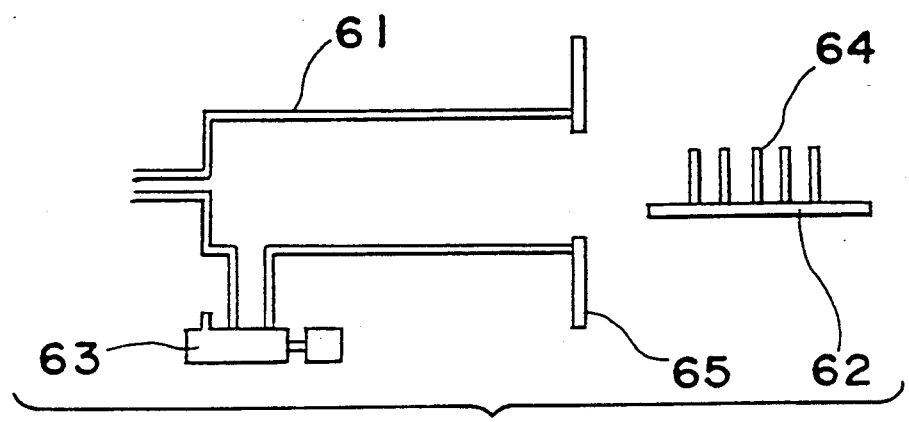
FIG. 13(D)

METHOD FOR MANUFACTURING A SEMICONDUCTOR DEVICE USING A HEAT TREATMENT ACCORDING TO A TEMPERATURE PROFILE THAT PREVENTS GRAIN OR PARTICLE PRECIPITATION DURING REFLOW

BACKGROUND OF THE INVENTION

1. Field of the Invention

The present invention relates to a method for manufacturing a semiconductor device and more particularly to a heat treatment for a semiconductor device having an oxide film incorporated with impurities of boron and phosphorus.

2. Description of the Prior Art

A semiconductor device of the type manufactured in recent years is provided with a fine circuit pattern and has a stage depth made deeper after an etching process. In particular a dynamic random access memory device has a stacked storage node and a circuit formed by a multi-layer circuit method. Therefore, it is necessary to make the stage depth flat for an easy formation of a lithography pattern or an easy execution of the etching process on the top layer. The top layer can be made flat by the step of depositing of an oxide film containing boron and phosphorus, that is, borophosphosilicate glass (referred to BPSG hereinafter) on the top layer and heating at a temperature higher than 900° C. to subject the BPSG to a reflow process. This method is disclosed in, for example, Oki Denki Research Development 130, Vol. 53, p. 79 (April, 1986) and 140, Vol. 55, p. 123.

A conventional heat treatment has been carried out in a following way: FIG. 15(A), 15(B), and 15(C) are schematic views showing a manufacturing chart of the conventional heat treatment for the oxide film and illustrating the positions of substrates put in a heating boat against the furnace tube during the various heat treatments. With reference to FIG. 15, a reference numeral 81 denotes a furnace tube and a reference numeral 82 denotes a heating boat. A reference numeral 83 denotes a substrate having the BSPG deposited thereon the heating boat 82. FIG. 16 is a graph showing a heat profile according to the conventional heat treatment of the oxide film.

With reference to FIG. 15, the conventional heat treatment of the oxide film deposited on the substrate is described in connection with the various manufacturing steps. At a boat putting-in process, the substrates 83 are arranged on the heating boat 82 as shown in FIG. 15 (A) and are put in the furnace tube 81 as shown in FIG. 15 (B). After the heating up process 92, the substrates are subjected to the heat treatment at a temperature higher than 900° C. during a heat treatment process 93 as shown in FIG. 16. The BPSG deposited on the top layer shows a lower viscosity coefficient and becomes flat with time due to the surface tension. Finally, the substrates 83 on the heating boat 82 are pulled out from the furnace tube 81 to the outside air during the boat putting-out process as shown in FIG. 15 (C).

In the conventional reflow method mentioned above, grains having a diameter of 0.1 μm to 10 μm are generated on the surface of BPSG by a chemical reaction of the boron and/or phosphorus in the BPSG with oxygen and/or vapor in the air or by a crystal growth in the BPSG. The observation of the precipitated grains by a reflection high energy electron diffraction analyzer or by an electron probe X-ray micro analyzer (EPMA) indicates clearly that the precipitated grains are composed of the crystal grains including a large amount of phosphorus and oxygen. The present inventors reported this finding at the lecture No. 26a-D-5 of fall meeting of the Japanese Applied Physics Soc. No. 51, 1990.

FIG. 17 shows mechanisms for the generation of grains. FIG. 17 (A) shows a mechanism of the grain growth in the gas phase and FIG. 17 (B) shows a mechanism of the grain growth in the solid phase. In FIG. 17, a reference numeral 101 denotes the BPSG and the reference numeral 102 denotes the precipitate grains. With reference to FIG. 17, the mechanism of the crystallization of grains will be described. As shown in FIG. 17 (A), oxygen and water vapor in air react with boron and phosphorus evaporated from the BPSG 101 and promote the grain growth of the precipitated grains 102 at the gas phase as shown in FIG. 17 (B). The BPSG at a critical temperature range causes the phosphorus oxide and the boron oxide to react with each other at the solid phase and to generate the precipitated grains.

The substrate according to the prior art causes the precipitated grains to prevent the surface of the BPSG from being flat. As a result, the conventional manufacturing method for a semiconductor device generates pattern defects or etching defects resulting from the precipitated grains and therefore has a very low manufacturing yield.

SUMMARY OF THE INVENTION

The object of the present invention is therefore to provide a method for manufacturing semiconductor devices which solves these problems.

The present invention has been developed with a view to substantially solving the above described disadvantages, and has for its essential object to provide an improved method for manufacturing semiconductor devices, in which the BPSG film is in a suitable concentration of boron oxide and phosphorus oxide in order to cause a sufficient gas flow so as to be free from the crystallized grains or particles, and is then subjected to a heat treatment to achieve the flat surface capable of forming the aluminum circuit in a high manufacturing yield.

In order to achieve the aforementioned objective, the substrates in a heating boat are spaced at a distance more than 4/16 inch during a heat treatment process for heating the substrate having a oxide film (BPSG) incorporated with the impurities formed thereon in accordance with the present invention.

The oxide film (BPSG) incorporated with impurities formed on the substrate is subjected to a heat treatment in an oxidizing atmosphere during all time or a partial time of the heat treatment. The partial time of the heat treatment includes a heating time, cooling time or both times. The oxidizing atmosphere consists of water vapor, halogen compound, oxygen or a mixture gas of the oxidizing atmosphere mentioned above and a non-oxidizing atmosphere. The non-oxidizing atmosphere consists of nitrogen or an inert gas.

A method for manufacturing a semiconductor device according to the present invention comprises a heat treatment step for heating the oxide film incorporated with boron and phosphorus as the impurities and a cooling step for cooling the oxide film in a gas flow at a flow rate higher than 20 l/min. The oxide film incorporated with boron and phosphorus as the impurities is cooled at a cooling rate more than 7° C./min in a temperature range of 900° to 850° C. Further, the oxide film incorporated with boron and phosphorus as the impurities is cooled at an atmospheric pressure lower than one normal atmosphere in a temperature range of 900° to 850° C.

Substrates spaced at a large distance according to the present invention make it possible to make the concentration of the boron and phosphorus atoms in the gas phase lower relatively, during the heat treatment, to that of the substrate. This prevents generation of the crystallized grains and permits a flat surface to be achieved by the heat treatment. As a result, the aluminum circuit formed during the later process can be achieved with an extremely high yield resulting in an improvement of the resultant semiconductor device.

The heat treatment of the BPSG film incorporated with boron and phosphorus as the impurities in an oxidizing atmosphere according to the present invention can cause the completion of the unsaturated atomic bonds of atoms constructing the oxide film. This prevents the generation of the crystallized grains and permits a flat surface to be achieved by the heat treatment. As stated above, the aluminum circuit formed during the later process can then be achieved with an extremely high yield resulting in an improvement of the resultant semiconductor device.

A cooling step carried out in a flowing gas at a flow rate more than 20 l/min can remove boron and phosphorus atoms with a high reactive ability from the surface of the BPSG and thus prevent the generation of the crystallized grains by increasing the cooling effect in accordance with the present invention.

Further, the generation of the crystallized grains are prevented by a cooling step according to the present invention in which the BPSG is cooled in an atmosphere free from oxygen or water vapor with a high reaction ability at a cooling rate higher than 7° C./min in a temperature range of 900° to 850° C. This means that the BPSG is cooled at a rate higher than that for the grain growth of the crystallized grains and accordingly can be free from the crystallized grains.

Furthermore, the generation of the crystallized grains are prevented by a cooling step according to the present invention in which the BPSG is cooled at a cooling rate higher than 7° C./min in a temperature range of 900° to 850° C. in an atmosphere at a pressure lower than 0.5 atm. to permit the surface of the BPSG to be free from atoms with a high reaction ability. As stated above, this means that the BPSG is cooled at a rate higher than that for the grain growth of the crystallized grains and accordingly can be free from the crystallized grains.

BRIEF DESCRIPTION OF THE DRAWINGS

These and other objects and features of the present invention will become clear from the following description taken in conjunction with the preferred embodiments thereof with reference to the accompanying drawings, throughout which like parts are designated by like reference numerals, and in which:

FIG. 4 is a diagram showing the number of grains generated under various atmospheres during the heat treatment period 14 and the cooling period 12.

FIGS. 13A, 13B, 13C, 13D are a series of schematic views for showing the heat treatment of the oxide film according to the fifth embodiment of the present invention.

FIGS. 17A, 17B show mechanisms generating grains by impurities contained in the oxide film for reflow.

DETAILED DESCRIPTION OF THE PREFERRED EMBODIMENTS

Embodiment 1

Figure 1A:
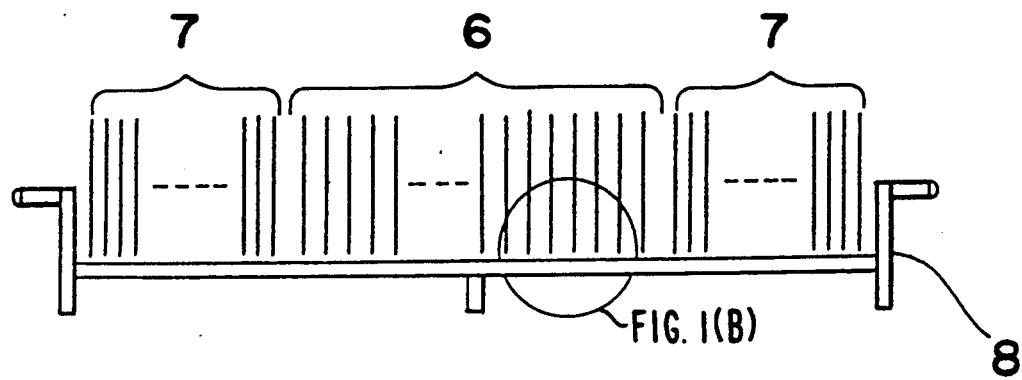
FIGS. 1A, 1B are a schematical sectional view of substrates placed on a heating boat according to the embodiment of the present invention.
Figure 1B:
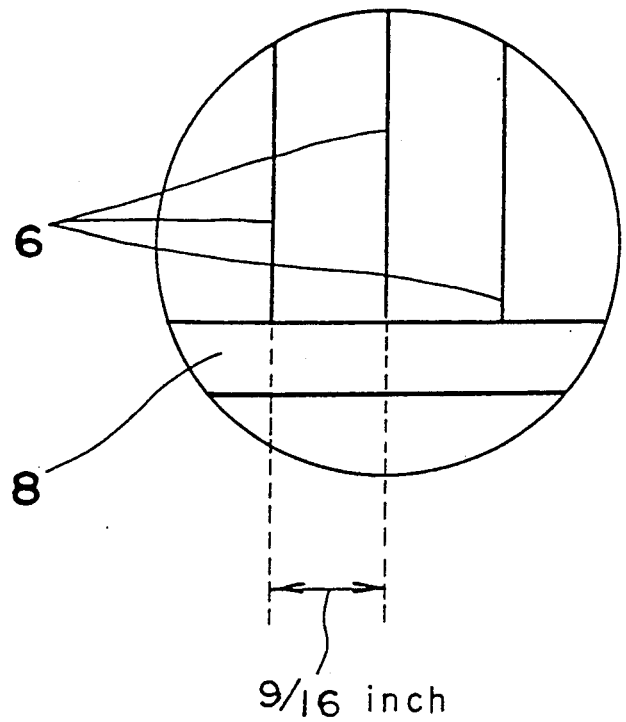

FIG. 1 is a sectional view showing wafers 6 set on a heating boat 8 made of quartz at a jig or predetermined pitch p. At both ends of the heating boat 8, there are arranged a plurality of dummy silicon substrates 7 to make the gas flow in a heat treating furnace uniform. Each wafer 6 to be heat treated is a semiconductor substrate on which a BPSG film is formed to improve the flatness of an interlayer insulating film.

Figure 2:
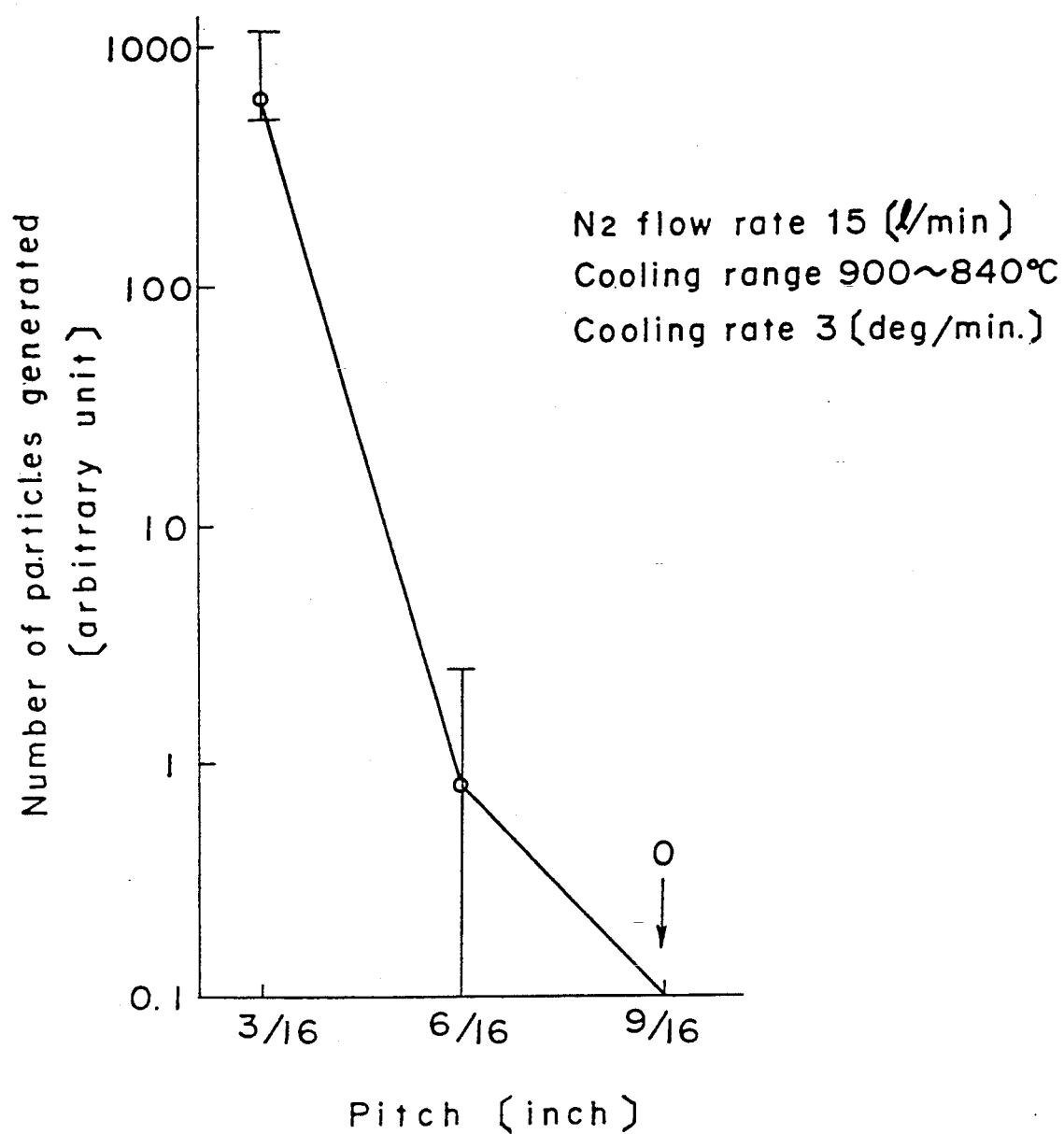
FIG. 2 is a graph showing a relation between the pitch of substrates and the number of grains generated.

FIG. 2 is a graph showing a relation between the number of grains generated and the pitch p of the wafers 6.

As is apparent from FIG. 2, the number of grains generated is greatly reduced as the pitch p increases. Conventionally it was set at 3/16 inch wherein too many grains were generated since the concentration of boron and/or phosphorus in the heat treating atmosphere became too high between adjacent semiconductor substrates. In contrast, if the pitch is set at 4/16

[inch] or more, no grains or particles are crystallized on the surface of the semiconductor substrate. Namely, this pitch is enough for preventing vaporized boron and/or phosphorus from crystallizing on the surface of the semiconductor substrate.

In this first preferred embodiment, the atmosphere is $N_2$ gas, the gas flow rate during the heat treatment is kept at 15 [l/min] and the cooling rate is set at 3 [°C/min] within the cooling range from 900° C. to 840° C.

Embodiment 2

Figure 3:
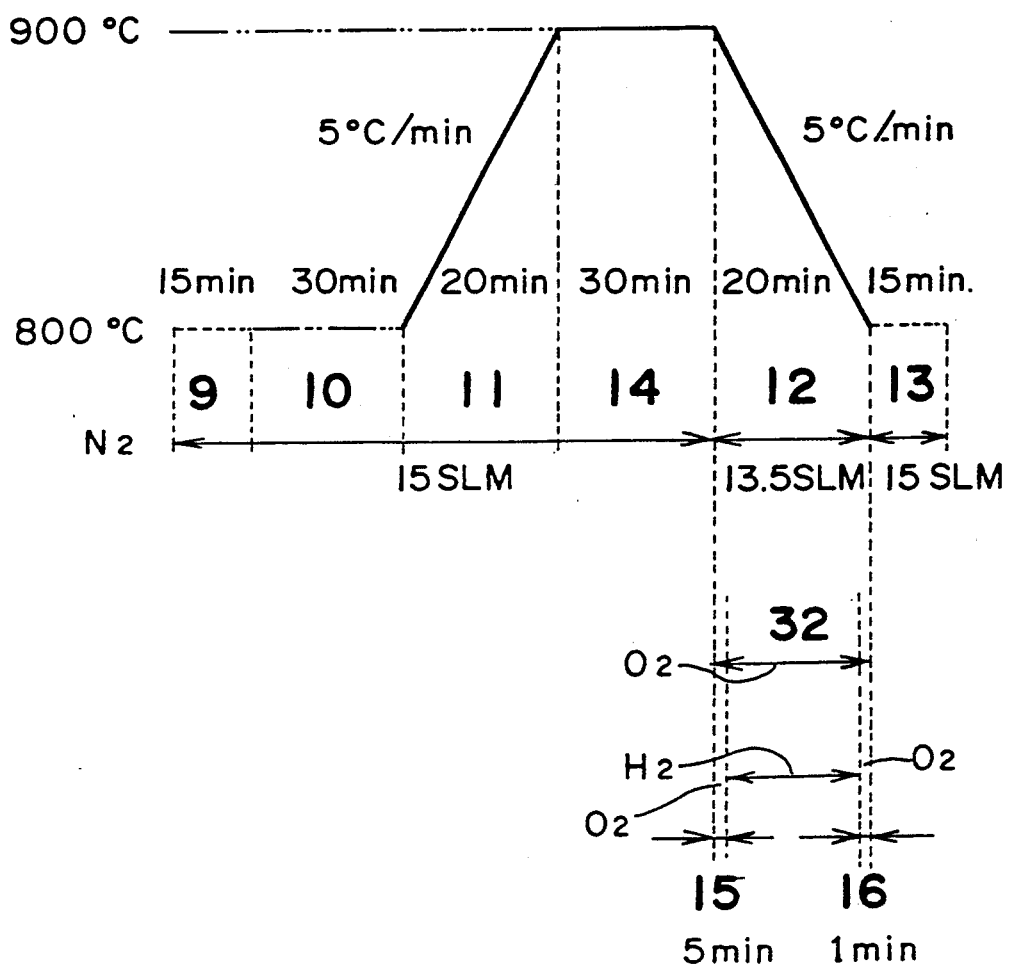
FIG. 3 is a graph showing a gas flowing condition combined with a profile of heating temperature and heating time according to the second embodiment of the present invention.

FIG. 3 is a graph showing a gas flowing condition combined with a furnace profile of heating temperature and heating time at the second embodiment according to the present invention. With reference to FIG. 3, a furnace profile is divided into the following periods in an order from the initial time for charging the boat into the furnace at a temperature of 800° C. to the termination time for pulling the boat out of the furnace at a temperature of 800° C.; a boat put-in period 9 at 800° C. for 15 min, a furnace temperature stabilization period 10 at 800° C. for 30 min, a heating up period 11 from 800° C. to 900° C. at a heating rate of 5° C./min for 20 min, a heat treatment period 14 at 900° C. for 30 min, a cooling down period 12 from 900° C. to 800° C. at a cooling rate of 5° C./min for 20 min, and a boat put-out period 13 at 800° C. for 15 min. A period from the initial time of the boat put-in period 9 to the end time of the heat treatment period 14 is provided with nitrogen gas of a flow rate of 15 SLM. The boat put-out period 13 is also provided with nitrogen gas of a flow rate of 15 SLM. The cooling down period 12 is provided with nitrogen gas flow of 13.5 SLM for all time, oxygen gas with a flow rate of 1 SLM for the initial 5 min (oxygen filling period 15) and for the terminal 1 min (residual hydrogen reaction period 16) and hydrogen gas with a flow rate of 1 SLM for the intermediate time 14 min (pyrogenic atmosphere period 32). The oxygen filling period 15 is a required time for filling uniformly the furnace with oxygen. The residual hydrogen reaction period 16 is a required time for completing the reaction of the residual hydrogen with oxygen. The heat treatment under such a furnace profile with the gas atmosphere mentioned above makes it possible to obtain the BPSG having no grains even when the substrates are spaced at a distance of 3/16 inch as in the conventional way. As a result, the formation of aluminum circuits during the later work step can be made with a high manufacturing yield without reduction of the through-put.

FIG. 4 is a diagram showing the relationship between the number of grains crystallized and the atmosphere used during the heat treatment period 14 and the cooling period 12. The number of the precipitated grains is obtained by observation through one view field of a 500 magnification optical microscope. First block (a) of FIG. 4 shows a furnace profile in which the heat treatment period 14 at 900° C. is provided with a pyrogenic atmosphere and the cooling period 12 from 900° C. to 700° C. is provided with nitrogen atmosphere. Second block (b) or third block (c) of FIG. 4 shows a furnace profile in which the heat treatment period 14 at 900° C. is provided with a pyrogenic atmosphere and the cooling period 12 is partially provided with nitrogen gas from 900° c. to 850° or 800° C. Fourth block (d) of FIG. 4 shows a furnace profile in which the heat treatment period 14 is provided with nitrogen gas and the cooling period 12 from 900° C. to 700° C. is provided with the pyrogenic atmosphere. The furnace profile shown in (a) of FIG. 4 shows the largest number of the generated grains being 11×500. The furnace profile shown in (b) or (c) shows the number of generated grains being 0 or 1×500. The furnace profile shown in (d) of FIG. 4 shows generated grains of 0. From this data, it can be concluded that the pyrogenic atmosphere during the cooling period is a very important factor for reducing grains crystallized during the heat treatment.

Figure 5A:
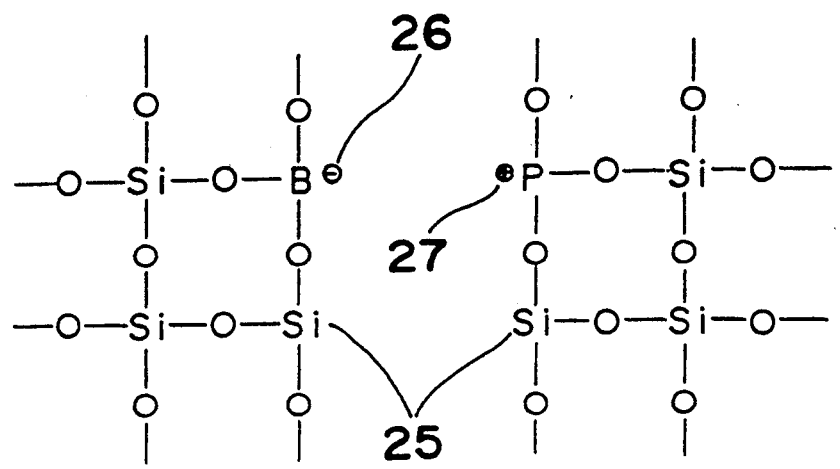
FIGS. 5A, 5B shows a molecular structure to explain a mechanism by which generation of grains in the BPSG is prevented under a pyrogenic atmosphere according to the embodiment of the present invention.
Figure 5B:
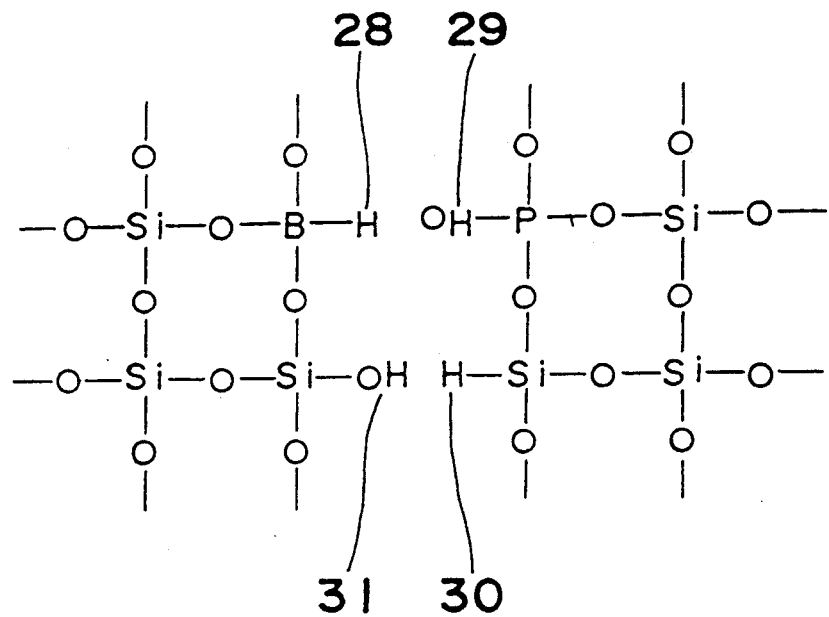

The following description with reference to FIG. 5 will be directed to a reason why the pyrogenic atmosphere is an important factor for decreasing the number of grains crystallized on the BPSG film during the cooling period. As shown in FIG. 5A, the BPSG film has many areas of unsaturated bonding 25, with boron atoms 26 charged negatively and phosphorus atoms 27 charged positively formed therein. It may be concluded that the unsaturated bonding 25 causes the formation of grains by forming newly saturated bonding during the heat treatment. When the BPSG film is subjected to the heat treatment at a high temperature ranging from 900° C. to 800° C. or 700° C. in the pyrogenic atmosphere, the water molecules ($H_2O$) generated in the pyrogenic atmosphere are absorbed to the surface of the BPSG film and decomposed into hydrogen ions and hydroxide ions or hydrogen radicals and hydroxide radicals. These ions or radicals diffuse into the BPSG film and terminate the activity of the unsaturated bonding 25, the boron atoms 26 negatively charged and the phosphorus atoms 27 positively charged in order to prevent the formation of new bonding as nucleus of the crystallization. No generation of this new bonding results in no generation of grains.

Figure 6:
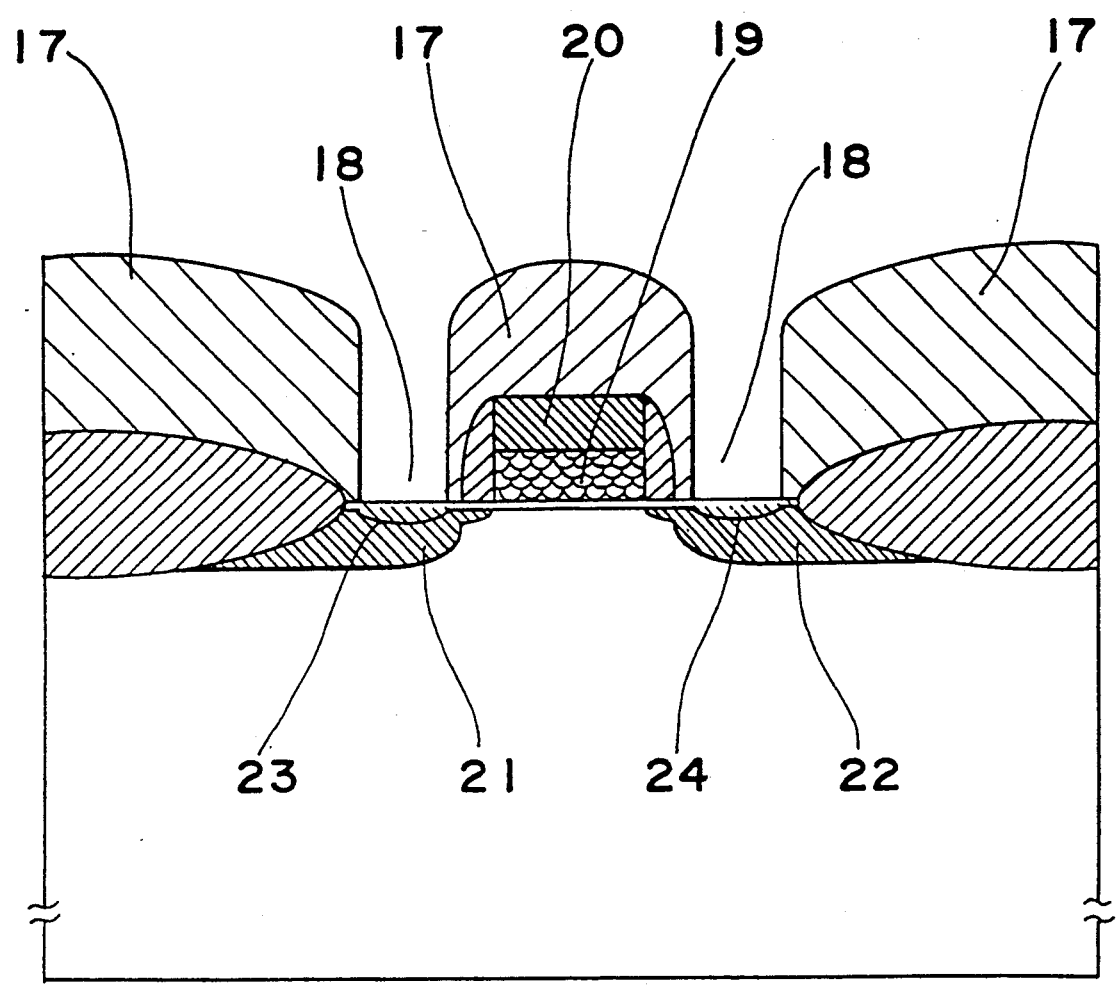
FIG. 6 is a sectional view of a MOS type transistor having a BPSG film to be heat-treated according to the present invention.

FIG. 6 is a sectional view of a MOS type transistor having the BPSG film heat treated in a way according to the present invention. The oxidization process by the pyrogenic atmosphere according to the prior art oxidizes the polycrystalline silicon gate 19 below the BPSG film and the source 21 and the drain 22 through the contact hole 18. Accordingly, there has been a problem that the circuit at the oxidized polycrystalline silicon gate has a large electric resistance. With reference to FIG. 6, reference numerals 20, 23 and 24 denote the oxidized polycrystalline silicon gate, the oxidized source, and the oxidized drain, respectively.

In the second embodiment according to the present invention, the oxygen flow rate and the hydrogen flow rate are 1 SLM, respectively, and are extremely lower in concentration of the oxidizing agent than that of the conventional pyrogenic oxidization process. Further, the pyrogenic atmosphere according to the embodiment of the present invention is achieved not at the heat treatment period (900° C. here) but at the cooling period, at a temperature lower than the heat treatment period. The oxidization by the pyrogenic atmosphere at a lower temperature results in a decrease in the oxidizing amount of the polycrystalline silicon gate below the BPSG film, the source area and the drain area. Accordingly, the second embodiment shows such an advantage in that the circuit at the polycrystalline silicon gate may have an electric resistance that is not increased. The decrease in the time period under the pyrogenic atmosphere and the amount of oxygen flow and hydrogen flow results in a decrease in the oxidization amount of the polycrystalline silicon gate 19, source 21, and drain 22 below the BPSG film. The BPSG film used here has a composition of 11.8 mol % of $B_2O_3$ and 56.8 mol % of $P_2O_5$. However, the composition should not be limited to this composition.

When the pyrogenic atmosphere is applied during the whole cooling period from 900° C. to 700° C. (cooling rate of 5° C./min and cooling time of 40 min), a silicon substrate has an oxidized film of 10 nm thickness formed thereon. This thickness of 10 nm is equivalent to one tenth of that obtained with the conventional oxidization by dry oxygen at 900° C. Therefore, it is possible to apply this pyrogenic atmosphere to the general semiconductor manufacturing process.

The heat treatment temperature is 900° C. in accordance with the second embodiment but may be a temperature other than 900° C., that is, 950° C. or 800° C. The boat put-in temperature and the boat put-out temperature are 800° C. but may be 750° or 700° C., respectively. It is not necessary that the boat put-in temperature and the boat put-out temperature be the same.

The non-oxidizing atmosphere is achieved by using nitrogen gas in accordance with the second embodiment but can be achieved by using an inert gas such as argon or helium. The flow amount of nitrogen, oxygen and hydrogen is not limited to those of the second embodiment. The water vapor according to the embodiment can be replaced by an oxidizing atmosphere such as hydrogen chloride (HCl) or other halogen compounds.

The pyrogenic atmosphere is used during the cooling period 12 (FIG. 3) in accordance with the second embodiment but can be used during the heating up period or for a partial amount of time during the heating up period, during the heat treatment period, or for a partial amount of time during the heat treatment period, or during the period that includes a partial amount of time for two or three of the periods that include the heating period 11, the heat treatment period 14, and the cooling period 12.

Embodiment 3

Figure 7A:
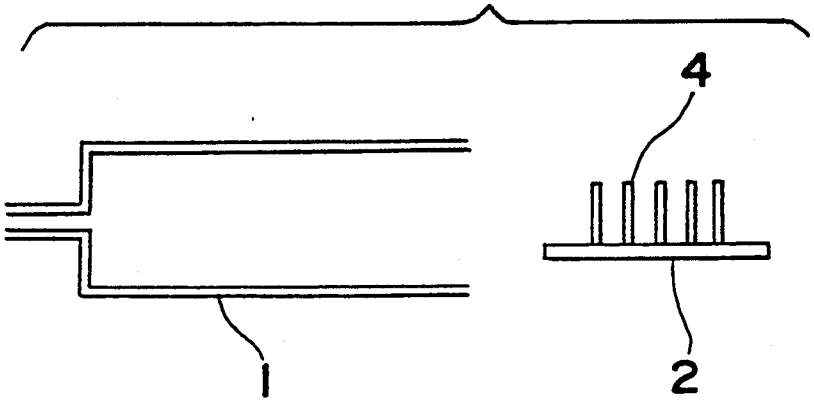
FIGS. 7A, 7B, 7C are a schematic view for showing a heat treatment process of the oxide film according to the third embodiment of the present invention.
Figure 7B:
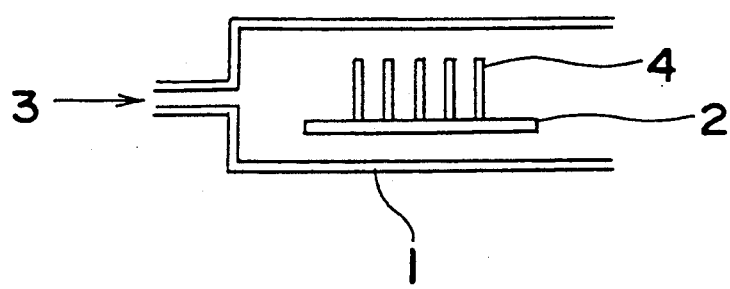
Figure 7C:
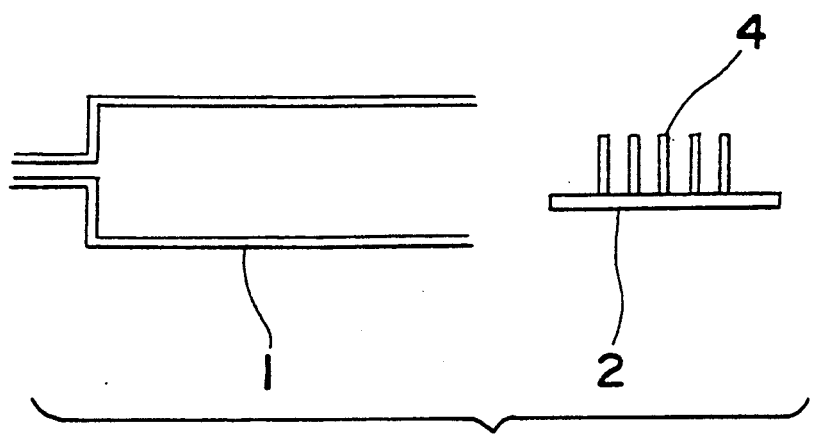
Figure 8:
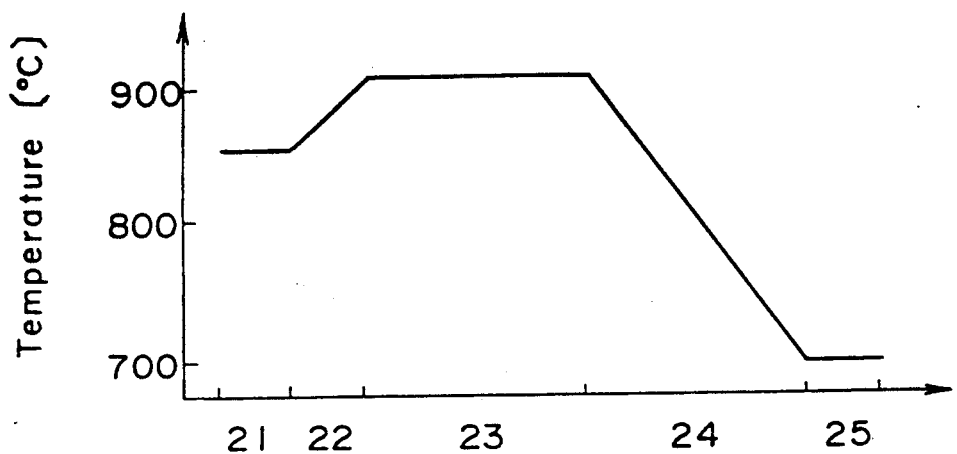
FIG. 8 is a diagram for showing a thermal hysterysis of the heat treatment for the oxide film according to the embodiment of the present invention.

FIG. 7 is a schematic view showing a heat treatment process of the oxide film according to the third embodiment of the present invention. With reference to FIG. 7, a reference numeral 1 denotes a furnace tube; a reference numeral 2, a heating boat; a reference numeral 3, gas; a reference numeral 4, a substrate having the BPSG film deposited thereon (referred to substrate hereinafter). The BPSG film is prepared from raw materials of silane, phosphine and diborane with a chemical vapor deposition method at atmospheric pressure and with a composition including more than 6.5% of $P_2O_5$ and more than 7.0% of $B_2O_3$. FIG. 8 is a graph showing a thermal hysterysis of the heat treatment for the oxide film according to this embodiment of the present invention. The process of the heat treatment for the oxide film is described with reference to FIGS. 7 and 8.

A heating boat 2 having the substrates 4 placed thereon is put in a furnace tube 1 during a boat put-in period 21 as shown in FIG. 8, and then is subjected to the heat treatment process 23 at a temperature higher than 900° C. after the heating up period 22. During the heat treatment period 23, the BPSG film shows the viscosity coefficient which decreases with time and becomes flat due to the surface tension. After the given time at the heat treatment period, the substrates are cooled at a cooling rate of 5° C./min from 900° C. to 850° C. in a nitrogen gas flow of a flowing rate of 20 l/min in accordance with the third embodiment. The cooling rate is preferably 7° C./min. During the boat put-out period 25, the boat 2 having the substrates 4 placed thereon is taken out from the furnace tube 1 to the outside in air as shown in FIG. 7.

FIG. 9 is a series of schematic views illustrating the mechanism for preventing the generation of grains in accordance with the present invention. The gas flow at a flow rate of 20 l/min according to the third embodiment can remove the boron atoms and the phosphorus atoms flying near to the surface of the BPSG film and then prevents the deposition of the boron atoms and the phosphorus atoms on the surface of the BPSG film, which results in the prevention of the crystallization as shown in FIG. 9 (A). In addition, the flowing rate of 20 l/min has a cooling effect to cool the surface of the BPSG film. A lower temperature around the BPSG film causes the suppression of the grain growth and the prevention of grains as shown in FIG. 9 (B).

Figure 10:
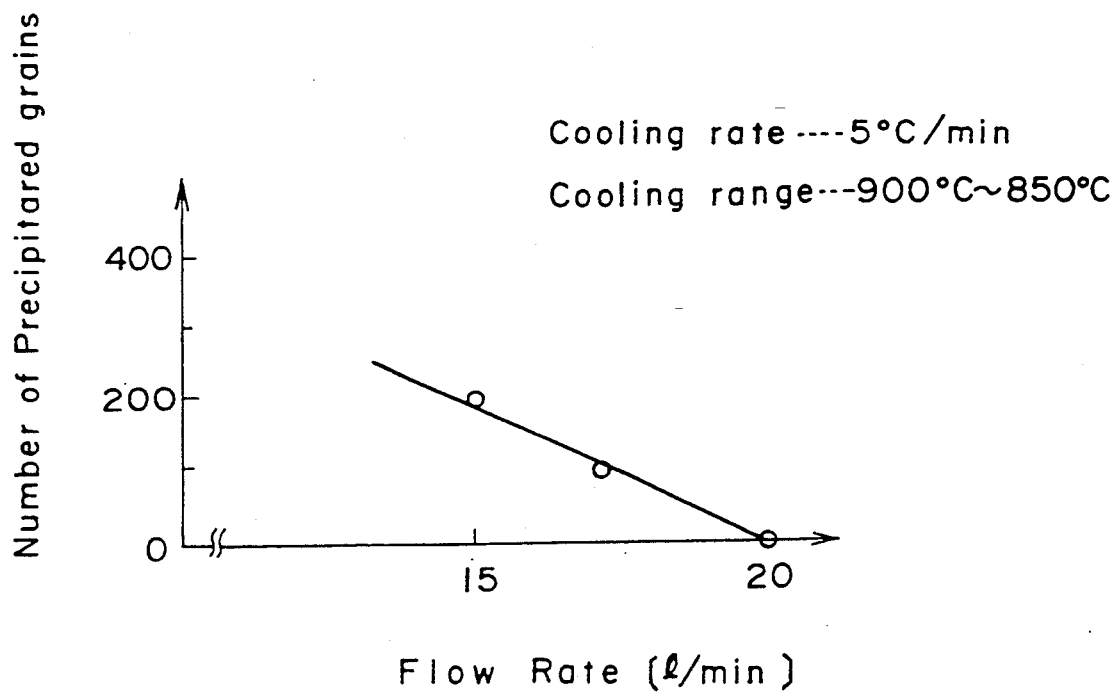
FIG. 10 is a graph showing the number of grains generated on a wafer of 6 inch diameter as a function of the gas flow rate.
Figure 9A:
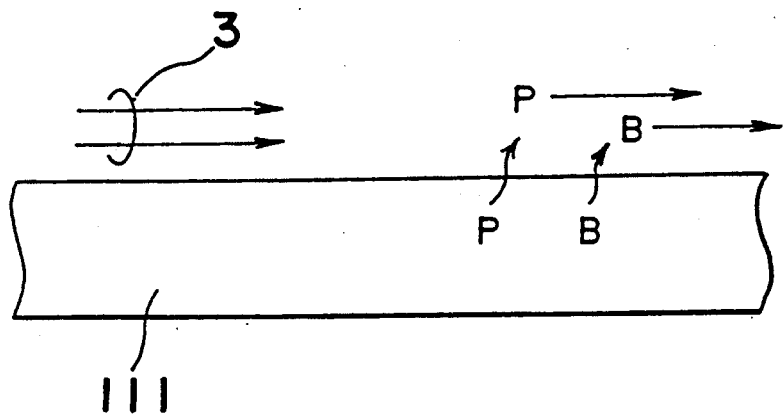
FIGS. 9A, 9B, 9C, 9D are a series of schematic views for illustrating a mechanism for preventing generation of grains in accordance with the present invention.
Figure 9B:
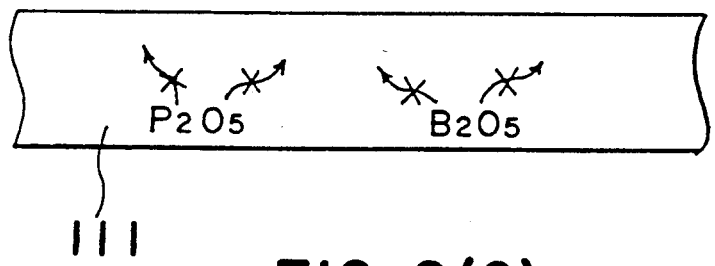
Figure 9C:
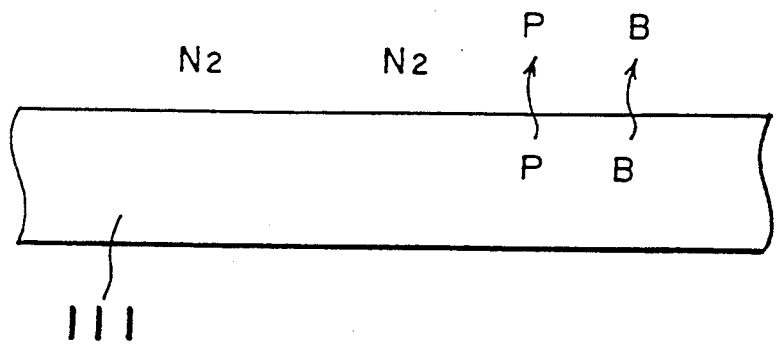
Figure 9D:
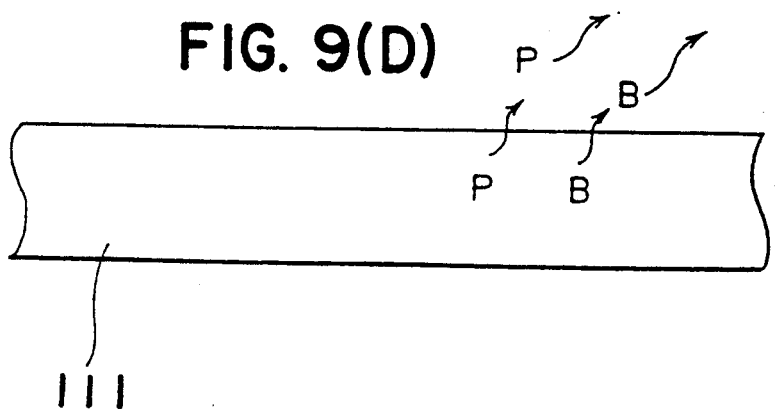

FIG. 10 is a graph showing the number of grains generated on a wafer of 6 inch diameter as a function of the gas flow rate. The substrates are cooled from 900° C. to 850° C. at a cooling rate of 5° C./min. It is found from FIG. 10 that a flow rate higher than 20 l/min prevents the generation of grains.

The flowing gas is composed of nitrogen in the third embodiment but can be composed of any other gas such as oxygen to obtain the same effect as that of nitrogen. During the cooling period 24 (FIG. 8), the substrates are cooled from 900° C. to 850° C. according to the third embodiment but can be cooled to any temperature lower than 850° C.

Embodiment 4

Figure 11:
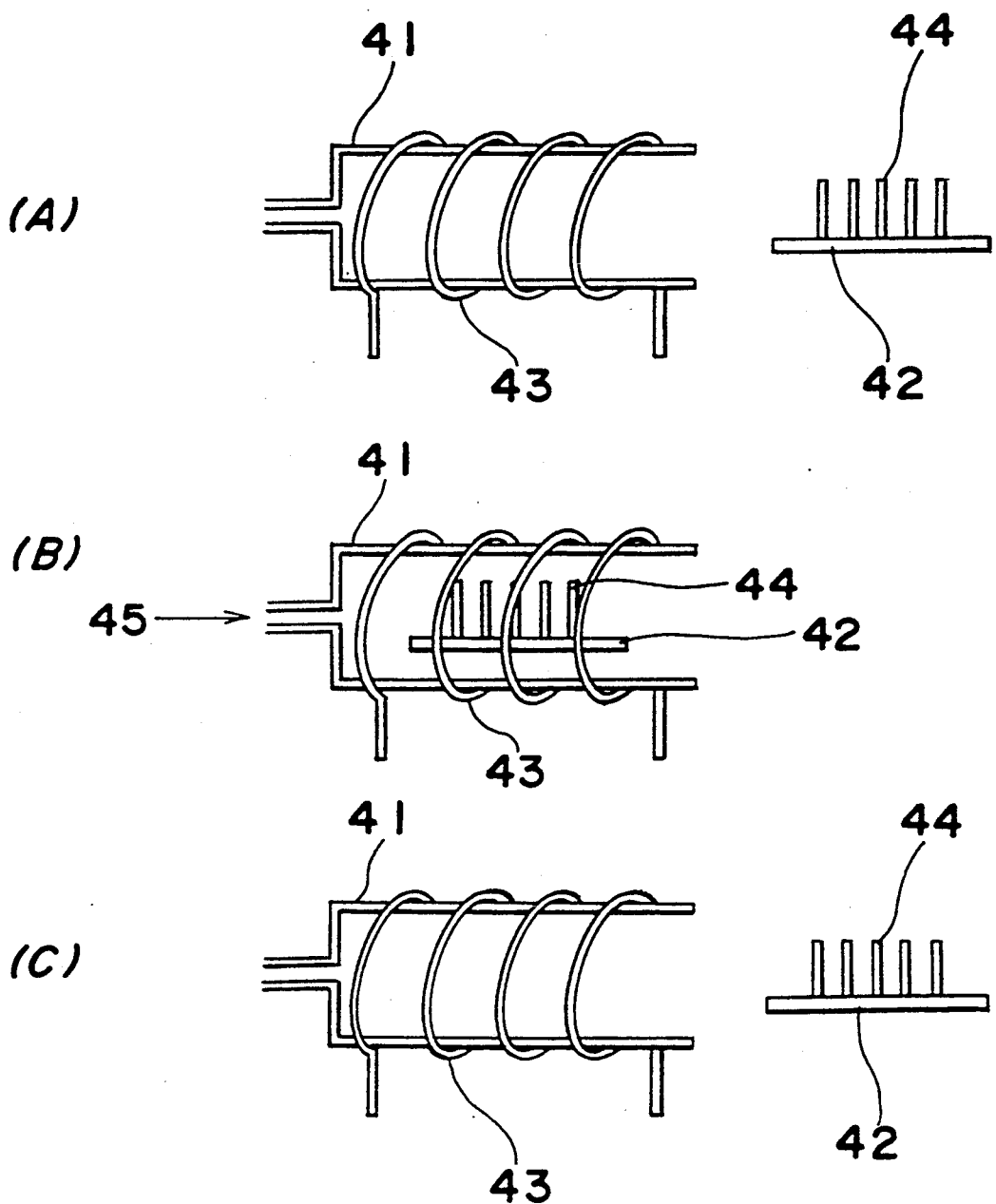
FIGS. 11A, 11B, 11C are a schematic view showing the heat treatment of the oxide film according to the fourth embodiment of the present invention.

FIG. 11 is a schematic view showing the heat treatment of the oxide film according to the fourth embodiment of the present invention. With reference to FIG. 11, a reference numeral 41 denotes a furnace tube; a reference numeral 42, a heating boat; a reference numeral 43, a water cooling pipe; a reference numeral 44, a substrate having the BPSG film deposited thereon, and a reference numeral 45, an inert gas. The BPSG film is prepared from raw materials of silane, phosphine and diborane with a chemical vapor deposition method at atmospheric pressure, and with a composition including more than 6.5% of $P_2O_5$ and more than 7.0% of $B_2O_3$.

Figure 12:
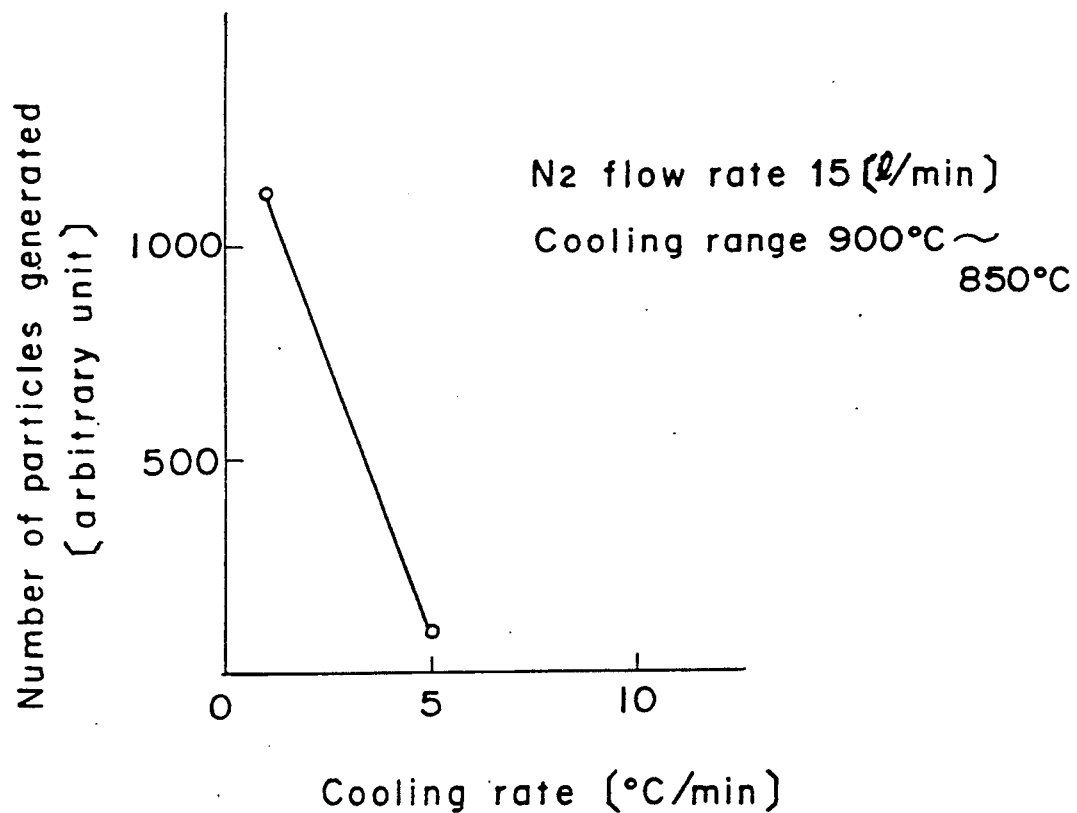
FIG. 12 is a graph showing the number of grains generated on a wafer of 6 inch diameter as a function of the cooling rate.

The process up to the cooling down period 24 is the same as that of embodiment 3 and is omitted in the description. The substrates are cooled down from 900° C. to 850° C. at a cooling rate higher than 7° C./min in a nitrogen gas flow at a flowing amount of 15 l/min, by using the flowing water through the pipe 43. FIG. 12 is a graph showing the number of grains generated on a wafer of 6 inch diameter as a function of the cooling rate. It is found that the cooling rate of 7° C./min at a temperature range from 900° C. to 850° C. completely prevents the generation of grains even with the nitrogen flow rate of 15 l/min. It is further found that the cooling rate of 7° C./min at a temperature range from 900° C. to 850° C. completely prevents the generation of grains even with the static nitrogen which fills the inside of the furnace and does not flow in the furnace. On the other hand, the cooling rate of 5° C./min at a temperature range from 900° C. to 850° C. causes the generation of grains on the BPSG film at a gas flow rate of 15 l/min. It is necessary for the prevention of crystallization to cool the BPSG film at a cooling rate higher than the grain growth rate within a temperature range from 900° C. to 850° C.

Embodiment 5

FIG. 13 is a schematic view showing the heat treatment of the oxide film according to the fourth embodiment of the present invention. With reference to FIG. 12, a reference numeral 61 denotes a furnace tube; a reference numeral 62, a heating boat; a reference numeral 63, a vacuum pump; a reference numeral 64, a substrate having the BPSG film deposited thereon, and a reference numeral 65, which is a shutter for keeping the furnace in a vacuum state. The BPSG film is prepared from raw materials of silane, phosphine and diborane with a chemical vapor deposition method at atmospheric pressure and with a composition including more than 6.5% of $P_2O_5$ and more than 7.0% of $B_2O_3$.

A thermal hysterysis of the heat treatment for the oxide film according to this embodiment is similar to that shown in FIG. 8. A heating boat 62 having the substrates 64 placed thereon is put in a furnace tube 61 during a boat put-in period 21 as shown in FIG. 8, and then is subjected to the heat treatment process 23 at a temperature higher than 900° C. after the heating up period 22. During the heat treatment period 23, the BPSG film shows the viscosity coefficient which decreases with time and becomes flat due to the surface tension. After the given time at the heat treatment period, the substrates are cooled at a cooling rate of 5° C./min from 900° C. to 850° C. in a reduced pressure of 0.5 atom. The reduced pressure is achieved by evacuating the furnace 61, closed by the shutter 65, with the vacuum pump 63. During the boat put-out period 25, the boat 62 is taken out from the furnace in a one atm. pressure to the outside air as shown in FIG. 13. It is preferable to cool down the BPSG film at a cooling rate of 7° C./min from 900° C. to 850° C.

Figure 14:
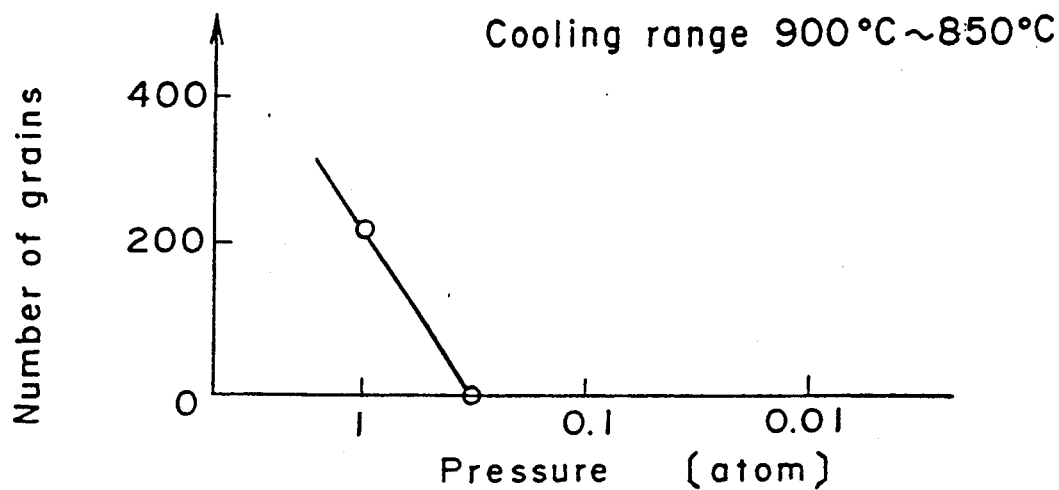
FIG. 14 is a graph showing the number of grains generated on a wafer of 6 inch diameter as a function of the pressure.
Figure 15A:
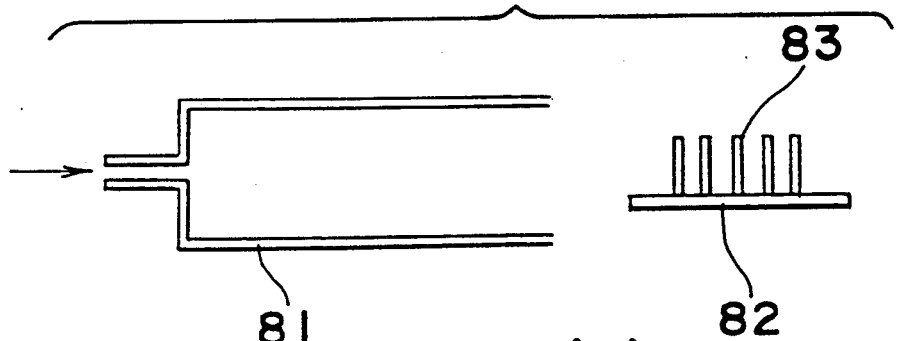
FIGS. 15A, 15B, 15C are a series of schematic views showing the heat treatment of the oxide film according to the prior art.
Figure 15B:
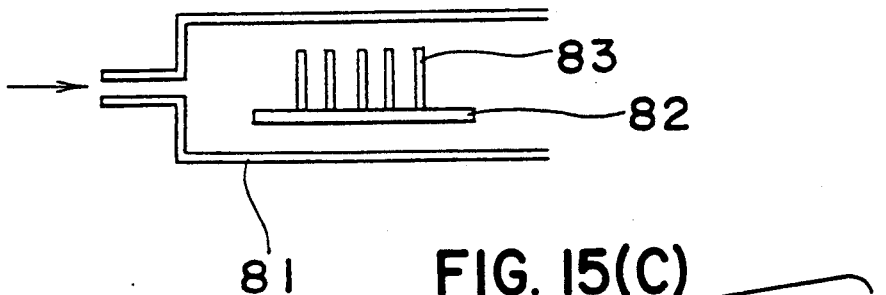
Figure 15C:
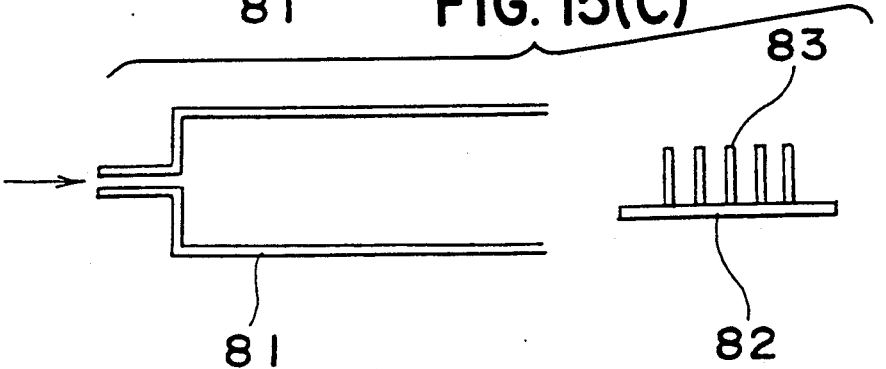
Figure 16:
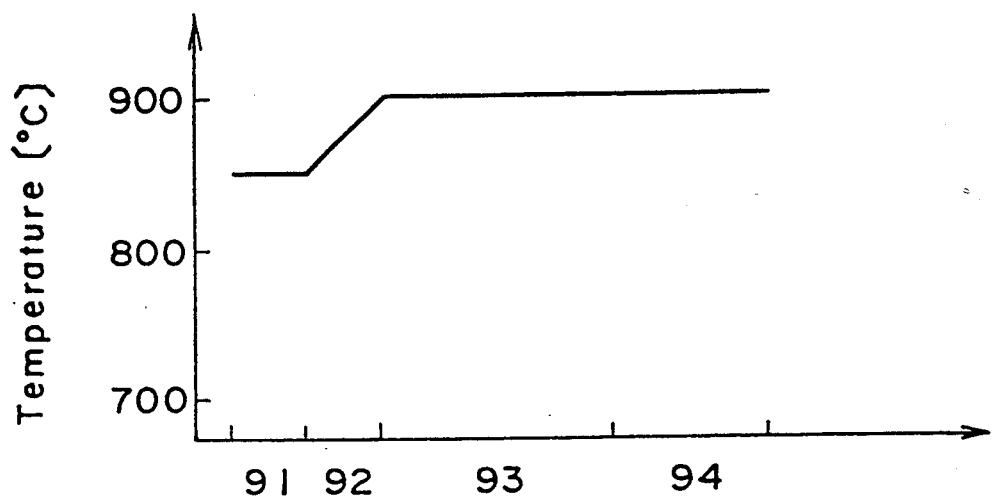
FIG. 16 is a diagram showing a thermal hysterysis of the heat treatment for the oxide film according to the prior art.
Figure 16:
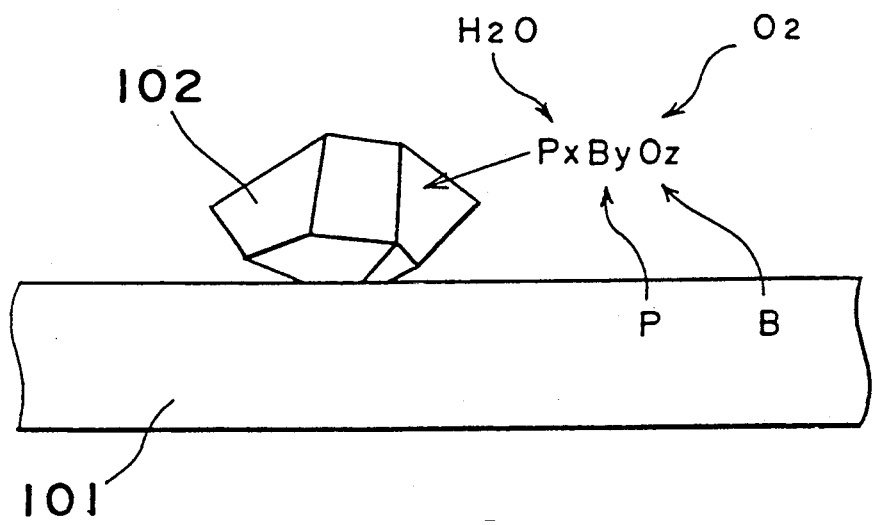
Figure 16:
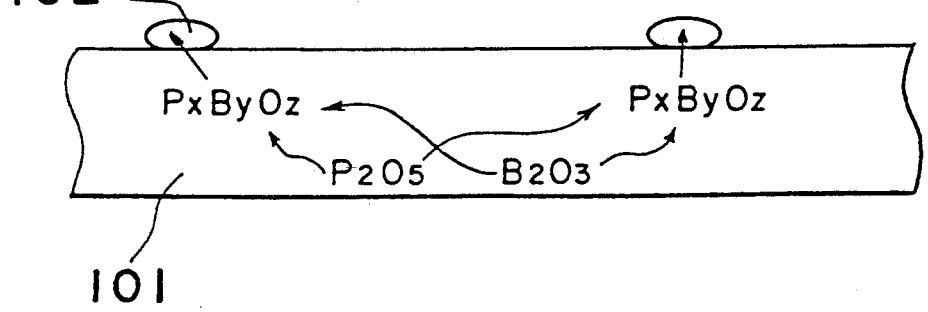

FIG. 14 is a graph showing the number of grains generated on a wafer of 6 inch diameter as a function of the pressure when the substrates are cooled at a cooling rate of 5° C./min from 900° C. to 850° C. It is found that the BPSG film cooled from 900° C. to 850° C. in a reduced pressure of 0.5 atm is completely free from the precipitated grains. This means that the reduced pressure in the furnace makes it possible to remove the flying boron atoms, phosphorus atoms and oxygen molecule near the surface of the BPSG film and to suppress the grain growth due to the gas reaction. Accordingly, the generation of grains are prevented by the suppression of the grain growth.

The reduced pressure is applied to only the cooling period 24 in the embodiment but can be applied to both the heat treatment period 23 and the cooling period 24 or to a period including the heating up period 22 to the cooling down period 24.

In the embodiment 3 to the embodiment 5, the BPSG film used has a composition including more than 6.5% of $P_2O_5$ and more than 7.0% of $B_2O_3$. A BPSG film in a composition including less than 6.5% of $P_2O_5$ and less than 7.0% of $B_2O_3$, however, has a disadvantage that the reflow process for obtaining the flat surface of the BPSG film is required to be carried out at a higher temperature or for a longer heating time. This is not desirable for the manufacturing of a semiconductor device.

In the embodiment 3 to the embodiment 5, the heat treatment period is carried out at a temperature higher than 900° C. On the other hand, the heat treatment period at a temperature lower than 900° C. can not achieve the flat surface of the BPSG film during the reflow process.

The BPSG film is prepared from raw materials of silane, phosphine and diborane with a chemical vapor deposition method at atmospheric pressure but can be prepared by using any other possible raw material such as TEOS and by using any other available formation method such as a plasma CVD.

In the embodiment 1 to the embodiment 3, the furnace tube is opened to the outside air at one terminal. It is possible to use a furnace in which the boat is surrounded with a pipe, and the pipe with the boat, is inserted in the furnace and is provided with a flowing gas. It is also possible to use a furnace in which the substrates can be taken out from the furnace to a room filled with gas during the boat put-out period.

As mentioned above, a method for manufacturing semiconductor devices according to the present invention can provide a silicon substrate having a BPSG film which is free from the precipitated grains and is capable of forming the flat surface by the reflow process resulting in a high manufacturing yield for the aluminum circuit formation during a later work step.

A method for manufacturing semiconductor devices according to the present invention comprises a step that cools down the BPSG film with a gas flow at a flowing rate more than 20 l/min for the purposes of preventing the precipitated grains by removing the free boron atoms, phosphorus atoms and oxygen molecules from the surface of the BPSG film. The BPSG film free from the generation of grains makes it possible to obtain the flat surface during the later work step and to decrease the defects in the pattern formation work and the etching process.

A method for manufacturing semiconductor devices according to the present invention comprises a step to that cools down the BPSG film from 900° C. to 850° C. at a cooling rate higher than 7° C./min in a gas atmosphere inert to phosphorus and boron. A cooling rate higher than 7° C./min at a temperature range from 900° C. to 850° C. is higher than the grain growth rate at the temperature range from 900° C. to 850° C., and thus can suppress the generation of grains on the BPSG film. The BPSG film free from the grains has advantages as mentioned above.

A method for manufacturing semiconductor devices according to the present invention comprises a step that cools down the BPSG film in a reduced pressure in order to remove the boron atoms, phosphorus atoms and oxygen molecules from the surface of the BPSG film, thus preventing the generation of the precipitated grains. The BPSG film free from the precipitated grains has a advantages mentioned above.

A method for manufacturing the semiconductor device according to the present invention makes it possible to obtain a flat surface on the BPSG film during the later work step through a reflow process that uses a BPSG film in a composition including more than 6.5% of $P_2O_5$ and more than 7.0% of $B_2O_3$, or by carrying out the heat treatment period 14 at a temperature higher than 900° C.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A manufacturing method for semiconductor devices comprising the steps of: (a) charging a plurality of semiconductor substrates into a heat treatment furnace, said semiconductor substrates being arranged on a jig for conveying them at a pitch; and (b) subjecting said plurality of semiconductor substrates to a heat treatment according to a temperature profile, thereby flattening the surface of said semiconductor substrates by reflowing an insulating film containing impurities formed thereon, at least a part of said heat treatment using an atmosphere including at least one compound selected from a group consisting of water vapor and halogen compounds.

2. The manufacturing method as claimed in claim 1, said atmosphere comprising a pyrogenic atmosphere.

3. The manufacturing method as claimed in claim 1, said heat treatment including a cooling process.

4. The manufacturing method as claimed in claim 2, said heat treatment including a cooling process.

5. The manufacturing method as claimed in either one of claims 1, 2, 3 or 4, wherein said insulating film comprises a borophosphosilicate glass.

6. The manufacturing method for semiconductor devices as claimed in claim 1 in which said heat treatment is carried out at atmospheric pressure.

7. The manufacturing method for semiconductor devices as claimed in claim 1 in which said heat treatment is carried out at a sub-atmospheric pressure.

8. The manufacturing method for semiconductor devices as claimed in claim 6 or 7 in which said insulating film comprises borophosphosilicate glass.

9. A manufacturing method for semiconductor devices comprising the steps of: (a) charging a plurality of semiconductor substrates into a heat treatment furnace, said semiconductor substrates being arranged on a jig for conveying them at a pitch; and (b) subjecting said plurality of semiconductor substrates to a heat treatment according to a temperature profile, thereby flattening the surface of said semiconductor substrates by reflowing an insulating film containing impurities formed thereon, said pitch being set so that said impurities vaporized from said insulating film of one semiconductor substrate during said heat treatment will not adhere onto said insulating film of an adjacent semiconductor substrate.

10. The manufacturing method for semiconductor devices as claimed in claim 9 in which said insulating film comprises a borophosphosilicate glass.

11. The manufacturing method for semiconductor devices as claimed in claim 10, said pitch being set at about 4/16 of an inch or more.

* * * * *

UNITED STATES PATENT AND TRADEMARK OFFICE
CERTIFICATE OF CORRECTION

PATENT NO. : 5,314,848
DATED : May 24, 1994
INVENTOR(S) : Takatoshi Yasui et al.

It is certified that error appears in the above-indentified patent and that said Letters Patent is hereby corrected as shown below:

Col. 12, lines 1-3

Claim 6, please delete claim 6 without prejudice and insert new claim 6 as follows: --6. A manufacturing method for semiconductor devices comprising the steps of: (a) charging a plurality of semiconductor substrates into a heat treatment furnace, said semiconductor substrates being arranged on a jig for conveying them at a pitch; and (b) subjecting said plurality of semiconductor substrates to a heat treatment according to a temperature profile, thereby flattening the surface of said semiconductor substrates by reflowing an insulating film containing impurities formed thereon, at least a part of said heat treatment using an atmosphere including at least one compound selected from a group consisting of water vapor and halogen compounds, said heat treatment being carried out at atmosphere pressure.--.

UNITED STATES PATENT AND TRADEMARK OFFICE
CERTIFICATE OF CORRECTION

PATENT NO. : 5,314,848
DATED : May 24, 1994
INVENTOR(S) : Takatoshi Yasui et al.

It is certified that error appears in the above-indentified patent and that said Letters Patent is hereby corrected as shown below:

Col. 1, line 19, after "particular" insert a comma

Col. 3, line 18, after "phosphorus" delete "as"

Col. 4, line 52, before "heating" insert --jig or--; and after "at a" delete "jig or"

Col. 6, line 30, after "charged" insert a comma

Col. 7, line 14, after "950°C or" insert --850°C and--

UNITED STATES PATENT AND TRADEMARK OFFICE
CERTIFICATE OF CORRECTION

PATENT NO. : 5,314,848
DATED : May 24, 1994
INVENTOR(S) : Takatoshi Yasui et al.

It is certified that error appears in the above-indentified patent and that said Letters Patent is hereby corrected as shown below:

Col. 10, line 12, delete the comma after "pipe"; and insert a comma after the second occurrence of "pipe"

Col. 10, line 27, after "min" insert a comma

Signed and Sealed this

Thirteenth Day of December, 1994

Attest:

BRUCE LEHMAN

Attesting Officer        Commissioner of Patents and Trademarks